US010855222B2

United States Patent
Robinson et al.

(10) Patent No.: US 10,855,222 B2
(45) Date of Patent: Dec. 1, 2020

(54) CLOCK SYNTHESIZER WITH INTEGRATED VOLTAGE DROOP DETECTION AND CLOCK STRETCHING

(71) Applicants: Advanced Micro Devices, Inc., Santa Clara, CA (US); ATI Technologies ULC, Markham (CA)

(72) Inventors: Dirk J. Robinson, Ft. Collins, CO (US); Andy Huei Chu, Saratoga, CA (US); Yan Sun, Richmond Hill (CA); Saket Sham Doshi, Ft. Collins, CO (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 99 days.

(21) Appl. No.: 16/023,698

(22) Filed: Jun. 29, 2018

(65) Prior Publication Data
US 2020/0007082 A1    Jan. 2, 2020

(51) Int. Cl.
| H03B 5/06 | (2006.01) |
| G05F 1/10 | (2006.01) |
| H03B 5/04 | (2006.01) |
| H03K 5/00 | (2006.01) |

(52) U.S. Cl.
CPC ............... *H03B 5/06* (2013.01); *G05F 1/10* (2013.01); *H03B 5/04* (2013.01); *H03K 5/00006* (2013.01)

(58) Field of Classification Search
CPC ........ H03B 5/04; H03B 5/06; H03K 5/00006; G05F 1/10
See application file for complete search history.

(56) References Cited

U.S. PATENT DOCUMENTS

| 2014/0254734 | A1* | 9/2014 | Abdelmoneum | ..... H03L 7/0995 375/376 |
| 2015/0002197 | A1* | 1/2015 | Chatterjee | ............... H03L 7/095 327/159 |
| 2017/0324417 | A1* | 11/2017 | Leibowitz | ............... H03L 7/093 |
| 2018/0284828 | A1* | 10/2018 | Mosalikanti | ............ H03L 7/093 |

OTHER PUBLICATIONS

Floyd, M., et al., "Adaptive Clocking in the POWER9TM Processor for Voltage Droop Protection," ISSCC 2017, Session 26, Processor-Power Management and Clocking, 26.5, pp. 444-445.
Kim, B., et al., "A 32nm, 0.9V Supply-Noise Sensitivity Tracking PLL for Improved Clock Data Compensation Featuring a Deep Trench Capacitor Based Loop Filter," 2013 Symposium on VLSI Circuits Digest of Technical Papers, pp. C162-C163.
Yanggong, Y., et al., "Asymmetric Frequency Locked Loop (AFLL) for Adaptive Clock Generation in a 28nm SPARO M6 Processor," IEEE Asian Solid-State Circuits Conference, Nov. 10-12, 2014, pp. 373-376.

* cited by examiner

*Primary Examiner* — Jeffrey M Shin
(74) *Attorney, Agent, or Firm* — Zagorin Cave LLP

(57) ABSTRACT

A clock synthesizer has integrated voltage droop detection and clock stretching. An oscillator of the clock synthesizer receives a control current from a digital to analog converter and generates an oscillator output signal. A droop detector and clock stretching circuit responds to a voltage droop of a supply voltage supplying circuits coupled to the oscillator output signal, to cause a portion of the oscillator control current to be diverted from the oscillator to thereby cause the oscillator to reduce the first frequency. The diversion can be accomplished through shunt circuits or a current mirror circuit.

20 Claims, 7 Drawing Sheets

CLOCK SYNTHESIZER WITH INTEGRATED VOLTAGE DROOP DETECTION AND CLOCK STRETCHING

BACKGROUND

Description of the Related Art

In central processing unit (CPU)/graphics processing unit (GPU) systems, for most efficient computation, the power supply voltage should be lowered to the minimum value at which the logic can function correctly, for a given clocking frequency. However, these systems deal with rapidly changing current consumption, which causes fluctuation of the supply voltage as seen at the silicon. A rapid increase in current consumption can result in voltage "droop", which is the reduction in the voltage, as seen on silicon, relative to the ideal supply value caused by the current consumption. To account for this droop, the supply voltage should be increased, or the clock frequency can be made to vary with the supply voltage at the silicon, which will be referred to as "clock stretching". While clock stretching circuits are known, improved clock stretching circuits can result in improved CPU/GPU performance.

SUMMARY OF EMBODIMENTS OF THE INVENTION

In an embodiment a method includes supplying an oscillator control current to cause an oscillator to supply an oscillator output signal with a first frequency. Responsive to occurrence of a voltage droop of a supply voltage, causing a portion of the oscillator control current to be diverted from the oscillator to cause the oscillator to supply the oscillator output signal with a second frequency lower than the first frequency.

In another embodiment a clock synthesizer includes an oscillator responsive to an oscillator control current to generate an oscillator output signal having a first frequency. A droop detector and clock stretching circuit responds to a voltage droop of a supply voltage, to cause a portion of the oscillator control current to be diverted from the oscillator and take another path away from the oscillator to thereby cause the oscillator to reduce the first frequency.

In another embodiment a method includes detecting a voltage droop of a supply voltage and supplying an indication of the voltage droop. Responsive to the indication of the voltage droop, removing a portion of a current supplied to the oscillator from a digital to analog converter (DAC) supplying the current and causing the portion of the current to take another path thereby slowing the oscillator responsive to the voltage droop.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
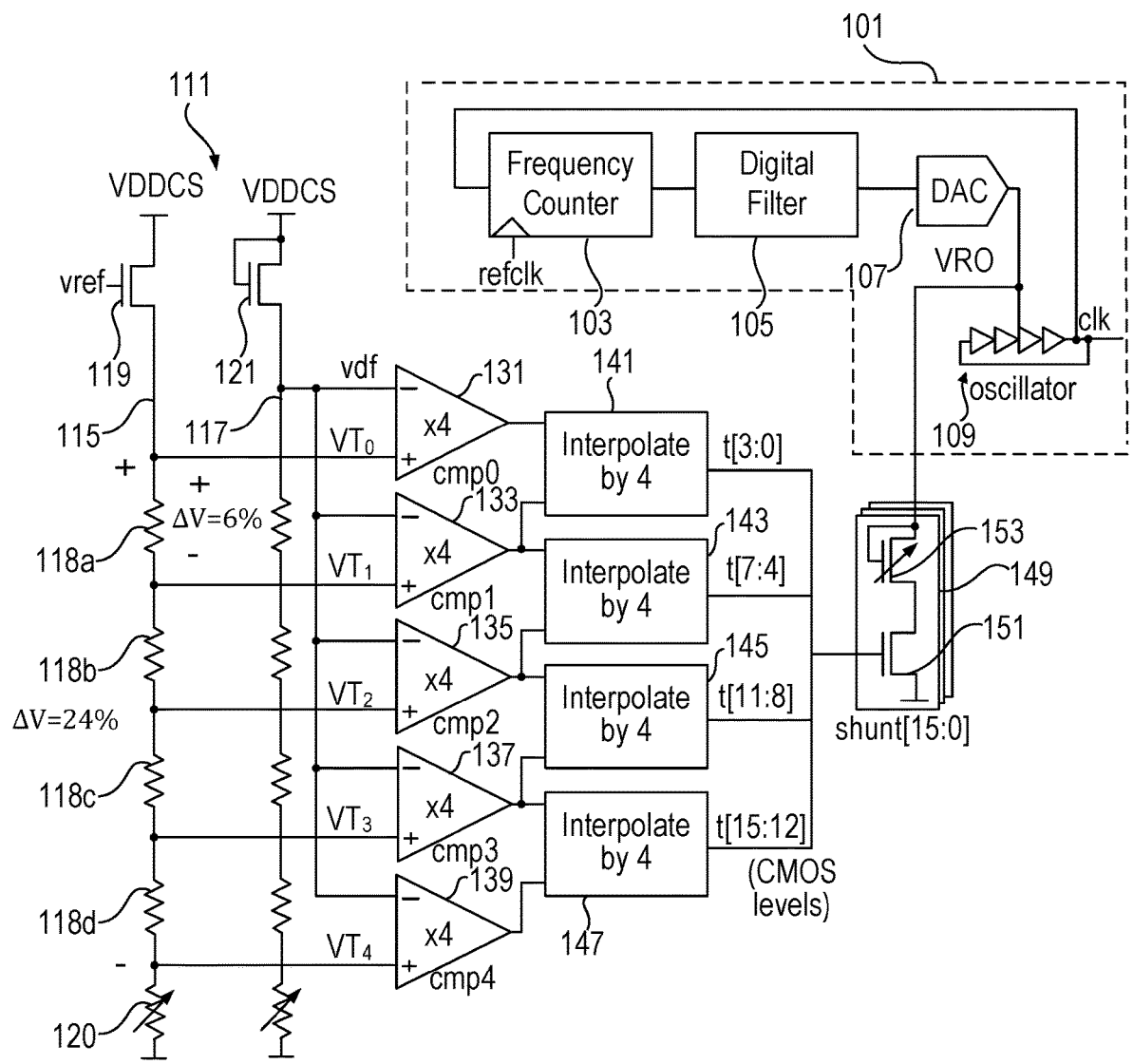
FIG. 1 illustrates a block diagram of an embodiment of a clock synthesizer with an integrated clock stretching function.

FIG. 1 illustrates a block diagram of an embodiment of a clock synthesizer with an integrated clock stretching function. The integrated approach allows a fast response to voltage droop. The illustrated clock synthesizer of FIG. 1 detects the voltage droop and stretches the clock (slows down the clock frequency) in response to a voltage droop. The embodiment of FIG. 1 includes a clock synthesizer with built-in mitigation for voltage droops. As described further herein, the embodiment of FIG. 1 provides a discrete, multi-level response to a voltage droop, uses a multi-stage comparator, and in some implementations uses shunt elements that are matched to the oscillator I-V curve.

FIG. 1 illustrates a conventional frequency synthesizer 101 using a frequency-locked loop (FLL) that includes a frequency counter 103, digital filter 105, digital to analog converter (DAC) 107, and oscillator 109. The DAC 107 supplies an oscillator control current that controls the frequency of the oscillator output signal (clk). A digital or analog phase-locked-loop could also be used, however, the FLL has advantages for clock stretching, since the FLL can recover from disturbances without overshooting, and the FLL can be more easily set to a low tracking bandwidth, which allows the clock stretching circuitry to respond to voltage droops at faster timescales. The remainder of FIG. 1 illustrates the droop detector and clock stretching circuit that reduces the oscillator frequency by shunting a portion of the control current supplied by the DAC to the oscillator, thus reducing the control current to the oscillator and lowering the oscillator frequency in response to a voltage droop. During non-droop operation, the current from the DAC corresponds to a target frequency. During droop a portion of the control current is shunted to ground through a different path causing the oscillator frequency to drop below the target frequency, thus providing built-in mitigation for voltage droops.

The droop detect and clock stretching circuit tracks the voltage supply VDDCS (VDD Clock Stretch) 111 and adjusts the frequency of oscillator 109 responsive to voltage droops. Note that in some implementations oscillator 109 is a current controlled oscillator directly controlled by the oscillator control current supplied by DAC 107. In other embodiments, the control current is converted to a voltage to control a voltage controlled oscillator (VCO). The voltage supply 111 supplies a pair of resistor-string structures 115 and 117 through respective NMOS devices 119 and 121 arranged in source-follower configurations at the top of the resistor strings. The left side resistor string 115 provides a series of fixed reference voltages for the comparators 131-139 to work with, based on a reference voltage "vref" supplied to the gate of transistor 119. In some implementations the gate reference voltage vref is provided from a resistor ladder as described further herein or from another stable voltage source. In the illustrated embodiment, each resistance 118a, 118b, 118c, 118d provides an approximately 6% drop in voltage across each resistor for a total of 24% of the resistor string. In addition, a variable resistor 120 can be used to adjust the voltage steps across each resistor. The right side resistor string 117 has an NMOS device 121 at the top with its gate connected to VDDCS. The NMOS devices 119 and 121 provide a voltage level shift to help ease the design of the comparators and isolate the loading of the reference voltage.

The five taps of the first resistor string 115 provide five reference voltages VT0-VT4 for the five comparators cmp0-cmp4 (131, 133, 135, 137, and 139). The comparators also receive the voltage vdf from the top most tap of resistor string 117, where vdf represents the supply voltage 111 after the voltage level shift through transistor 121. Each comparator remains zero until the voltage $VT_x$ is above vdf. Comparator 131 "fires" when VDDCS droops and $VT_0$ is above vdf. In non-droop conditions, the voltage $VT_0$ is approximately equal to vdf. The comparator 133 output remains zero until vdf drops more than 6% and VT1 is greater than vdf. The comparators provide a linear analog value representing the difference between VTx and vdf, where x corresponds to a tap between 0 and 4. In an embodiment, the comparators provide a gain of 4 (shown as x4 in FIG. 1). Note that lower gain helps with speed. The interpolate by 4 stages 141, 143, 145, and 147 receive the analog values from the comparators and interpolate using the analog values provided by adjacent comparators. Thus, interpolate stage 141 provides a four bit value (t[3:0]) corresponding to the difference between the output of comparators 131 and 133. Similarly, interpolate stage 143 provides a four bit value (t[7:4]) corresponding to the difference between the output of comparators 133 and 135. The five comparators cmp0-cmp4 131-139 and the "interpolate by 4" stages 141, 143, 145, and 147 are equivalent to a 16-level flash analog to digital converter (ADC). By using a multiple stage approach, the ADC has better step-size matching (differential non linearity (DNL)) and is more power efficient, while still having a fast response. Embodiments utilize comparators that are low gain and high speed, with nearly linear output over the range of the interpolators.

The 16-level ADC result (t[15:0]) is thermometer-coded, and the thermometer coded result directly controls 16 "shunt" elements 149. Each shunt element 149 includes a switching device 151 and a diode-connected device 153. In embodiments, the diode device 153 is implemented as a parallel combination of NMOS and PMOS diode-connected transistors, which are sized to closely match the voltage vs. current characteristic of the oscillator 109. That helps to maintain the relative frequency change amount for a given voltage droop amount, at different oscillator frequencies, and also compensates for process and temperature variations. In some implementations, the shunt elements are individually programmable to allow tuning of the frequency response vs. voltage droop. The ADC result can also be used externally to monitor the voltage droop amount.

Figure 2:
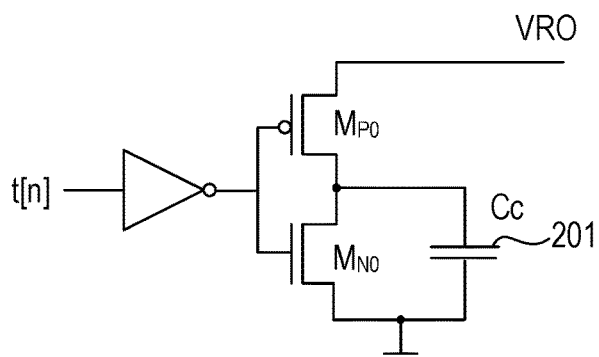
FIG. 2 illustrates an embodiment of a shunt speed boost circuit that improves the response time to droop events.

To improve the response time for droop events, in some implementations the "shunt speed boost" circuit shown in FIG. 2 is be added in parallel to each shunt element. The switched-capacitor circuit illustrated in FIG. 2 works by first shorting the terminals of capacitor $C_C$ 201 to ground. One of the terminals of capacitor $C_C$ is shorted to ground through transistor $M_{N0}$ when there is no voltage droop present (the thermometer code bit t[n]=0). The other terminal of capacitor Cc is already connected to ground. Then, when the voltage supply droops so that thermometer bit "t[n]" becomes one, transistor $M_{P0}$ turns on and $M_{N0}$ turns off, charging the capacitor from the oscillator voltage node VRO. That quickly discharges any capacitance on node VRO, helping to reduce the oscillator frequency more quickly when droops occur.

Figure 3:
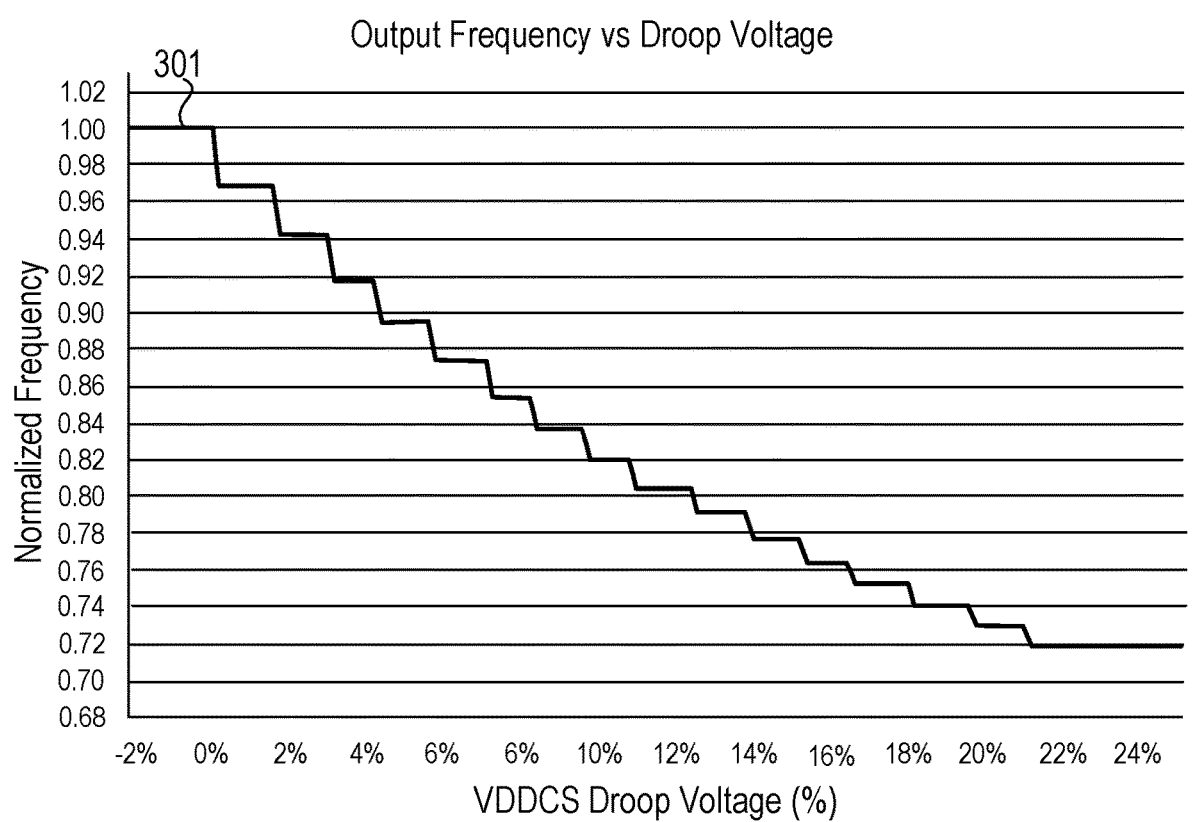
FIG. 3 illustrates a stepped frequency response to voltage droop that corresponds to an embodiment of the voltage droop and clock stretcher circuit illustrated in FIG. 1.

FIG. 3 illustrates a stepped frequency response to voltage droop that corresponds to an embodiment of the voltage droop and clock stretcher circuit illustrated in FIG. 1. With no droop, the normalized frequency is 1 at 301. As the droop increases, the embodiment of FIG. 1 responds with the stepped frequency response shown in FIG. 3. The frequency response curve is valid for time scales which are short compared to the frequency locked loop (FLL) loop bandwidth. For longer lasting droops, the frequency control loop starts to track back to the original frequency target.

Figure 4:
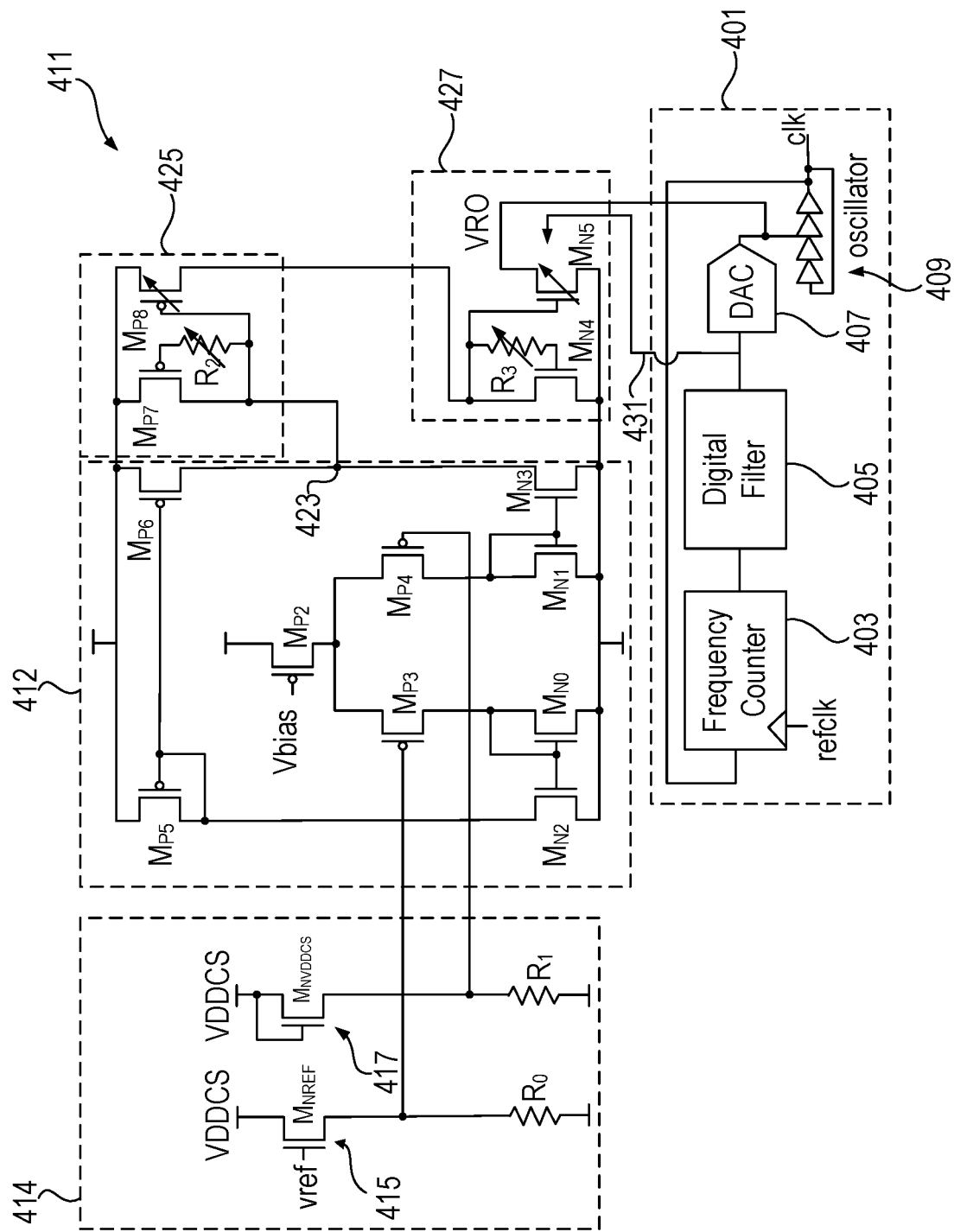
FIG. 4 illustrates another embodiment of a clock synthesizer with built in mitigation for voltage droops.

FIG. 4 illustrates another embodiment of a clock synthesizer with built in mitigation for voltage droops. As described in more detail herein, the embodiment of FIG. 4 includes a current-mirror operational amplifier topology, with a limiting response, and uses resistor peaking to improve the response time.

With reference to FIG. 4, a clock synthesizer with built in mitigation for voltage droop includes an FLL 401 that includes a frequency counter 403, digital filter 405, DAC 407, and oscillator 409. A digital or analog phase-locked-loop could also be used, however, the FLL has advantages for clock stretching, since it can recover from disturbances without overshooting, and it can be more easily set to a low tracking bandwidth, which allows the clock stretching circuitry to respond to voltage droops at faster timescales. The remainder of FIG. 4 illustrates the droop detector and clock stretching circuit 411 that includes circuits 412, 414, 425, and 427. The droop detector and clock stretching circuit 411 reduces the oscillator frequency by diverting current from the DAC 407, thus reducing the current to the oscillator and lowering oscillator frequency.

The droop detector and clock stretching circuit 411 operates to track voltage droops of the supply voltage VDDCS (VDD Clock Stretch), and to reduce the frequency of oscillator 409 in response to detected voltage droops. VDDCS connects to a pair of source-follower structures, each with an NMOS device (415 and 417) at the top in a source-follower configuration. The left side source-follower provides a fixed reference voltage for the droop detect and clock stretching circuit to work with, based on the reference voltage "vref", provided to the gate of transistor 415. In some implementations the reference voltage is provided by a resistor ladder as described further herein. The NMOS device 415 of the right side source-follower has a gate connected to VDDCS. The NMOS devices 415 and 417 provide a voltage level shift to help ease the design of the stretching circuit and isolate the loading of the reference voltage.

The droop-detect and clock stretcher circuit 411 further includes transistors $M_{P2}$-$M_{P8}$ and $M_{N0}$-$M_{N5}$. The droop detector and clock stretcher circuit 411 uses a current-mirror operational amplifier topology shown in circuit 412, ending at the drains of transistors $M_{P6}$ and $M_{N3}$. Two current mirrors 425 and 427 follow the circuit 412 with the current mirror 427 providing the current diversion to slow the frequency of oscillator 407.

The droop detect and clock stretcher circuit uses a differential pair circuit including transistors $M_{P2}$, $M_{P3}$, $M_{P4}$, $M_{N0}$, and $M_{N1}$. Transistor $M_{P2}$ provides a bias current for the differential pair circuit. The left most source follower provides a reference voltage as the gate voltage to transistor $M_{P3}$ and the right most source follower 417 provides a gate voltage to transistor $M_{P4}$. The right most source follower with transistor 415 provides a scaled version of the supply voltage VDDCS to the gate of $M_{P4}$. Absent a droop, the currents through the two branches of the differential pair are equal. When the term "equal" is used herein, the term is intended to include slight differences between voltages or currents caused by, e.g., mismatch in circuit components, temperature gradients, and/voltage variations. The current through transistors $M_{P3}$ and $M_{N0}$ is mirrored to flow through $M_{N2}$ using a current mirror formed by $M_{N0}$ and $M_{N2}$. The current through $M_{N2}$ also flows through $M_{P5}$, which current is mirrored using a current mirror formed by $M_{P5}$ and $M_{P6}$ to generate an output current through the output leg ($M_{P6}$) that corresponds to the reference voltage. The current through $M_{P6}$ provides an "up" current. The current through $M_{P4}$ and $M_{N1}$ corresponding to VDDCS is mirrored in the current mirror circuit formed by transistors $M_{N1}$ and $M_{N3}$ to form an output current in the output leg $M_{N3}$ that provides a "down" current. The use of a current-mirror op-amp topology provides that the up/down paths subtract out the DC current bias of the amplifier branches, leaving only a current proportional to VDDCS-Vref. Absent a droop, the up current through $M_{P6}$ and the down current through $M_{N3}$ cancel resulting in zero current (ignoring any mismatch or other non-idealities). Also, the push-pull nature of the topology helps to create a rectifying effect, so when up current is larger, it pulls the voltage high quickly to turn off the output current mirror stages. The drains of transistors $M_{P6}$ and $M_{N3}$ are coupled to current mirror 425 formed by transistors $M_{P7}$ and $M_{P8}$. Current mirror 425 provides the input current for current mirror 427 formed by transistors $M_{N4}$ and $M_{N5}$. The current through the output leg of current mirror 427 (through $M_{N5}$) diverts current away from oscillator 409 in the presence of droop.

When the supply voltage VDDCS is at the full voltage level (no droop), the up and down currents through $M_{P6}$ and $M_{N3}$ are equal, and no current flows through node 423 or current mirrors 425 and 427 and the frequency of oscillator 409 remains unaffected by the droop detect and clock stretching circuit 411. However, in response to a voltage droop of the supply voltage, the gate voltage of $M_{P4}$ decreases resulting in increased current through $M_{P4}$ and $M_{N1}$, which current is mirrored in $M_{N3}$ resulting in more down current than up current. That in turn causes an input current in current mirror circuit 425, an output current through $M_{P8}$ and an input current through $M_{N4}$ of current mirror circuit 427 and an output current through $M_{N5}$ that diverts DAC generated current away from the oscillator 409 to reduce the frequency of the oscillator. Thus, a current in current mirror 425 indicates a voltage droop.

The current mirror stages 425 and 427, along with the up/down current stage, have a rectifying effect, so that the additional frequency response is limited as VDDCS rises higher than "vref". That is valuable for systems where the maximum frequency needs to be limited, or when the digital logic speed increase tapers off with increasing voltage.

To improve the response time for droop events, embodiments include "peaking" resistors R2 and R3. Resistors R2 and R3 act in conjunction with the device gate capacitance at $M_{P7}$ and $M_{N4}$, respectively, to create a peak in the response function, and shorten the time delay from change in VDDCS to change in output frequency. In some implementations the resistors are variable so that they can be adjusted to maximize the effectiveness of the peaking resistors.

In order to have a more consistent droop response at changing oscillator frequencies and to reduce the sensitivity to process, temperature and supply voltage variation, embodiments provide that the DAC code 431 that sets the DAC oscillator control current and thus oscillator frequency also scales the gain of the current mirror 427. That is, the DAC code (or most significant bits (MSBs) of the DAC code) adjust the gain of the current mirror 427 by adjusting the width to length (W/L) ratio of the output leg $M_{N5}$ of the current mirror. Thus, as oscillator frequency increases, the DAC code 431 increases, which causes the gain of the current mirror 427 to increase, resulting in more current being removed from the oscillator to keep the clock stretching function proportional to frequency. In some implementations the W/L is adjusted in conventional ways by switching additional transistors into or out of the output leg as needed. By adjusting gain of the current mirror 427 based on the DAC code, the current contribution from the stretching circuit remains proportional to the DAC current. Note that in some implementations the gain of current mirror 425 is programmable.

Figure 5:
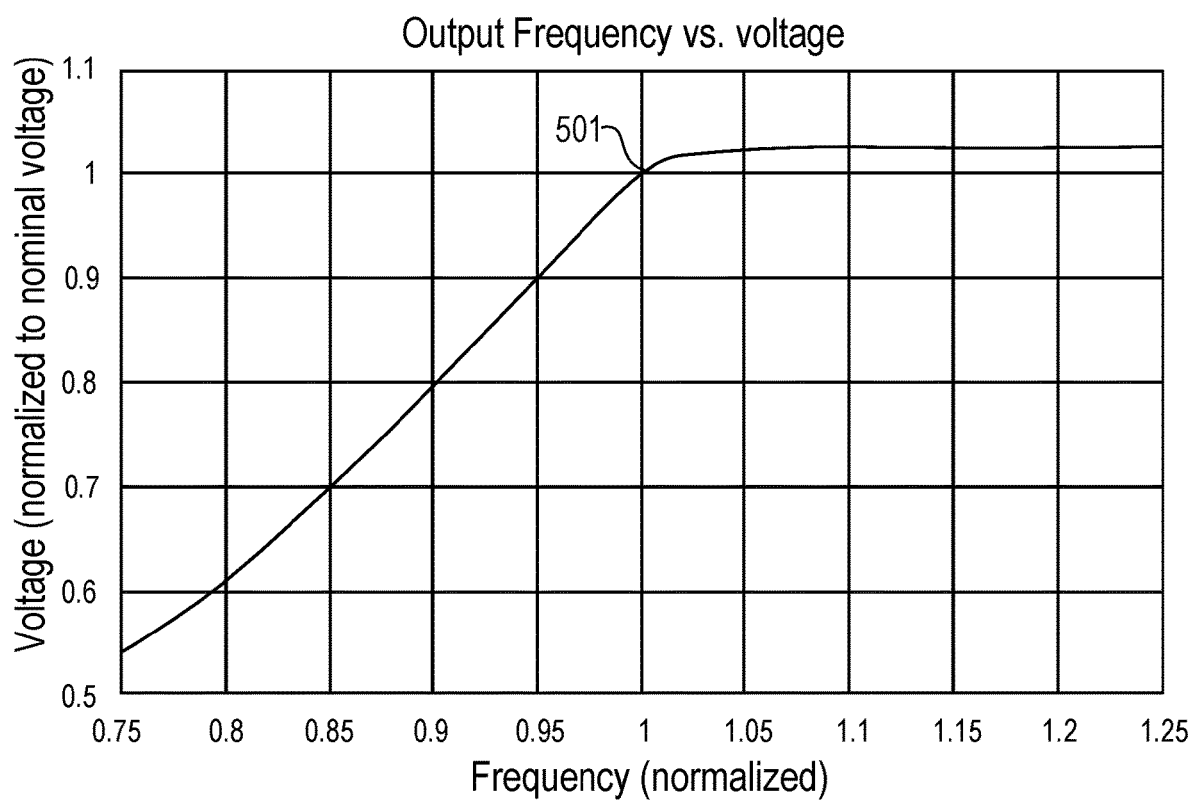
FIG. 5 shows an example frequency response for the embodiment illustrated in FIG. 4.

FIG. 5 shows a continuous (as opposed to step) frequency response for the embodiment illustrated in FIG. 4. The response shows frequency and voltage with no droop at 501. The illustrated response curve is valid for time scales which are short compared to the FLL loop bandwidth. For longer lasting droops, the frequency control loop starts to track back to the original frequency target. The frequency/voltage curve is adjusted by varying the size of $M_{P2}$ and the current mirrors $M_{P7}/M_{P8}$ and $M_{N4}/M_{N5}$.

Figure 6:
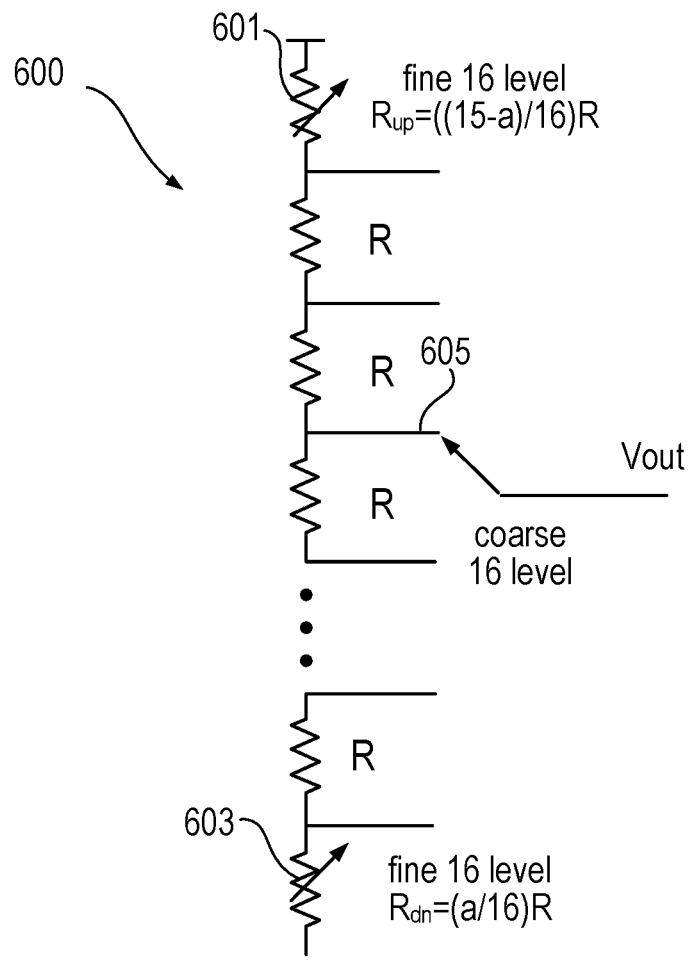
FIG. 6 illustrates an embodiment of a resistor ladder that utilizes fine-tuning resistors added to the ends of the resistor ladder structure to achieve better resolution.

An embodiment utilizes a resistor ladder incorporating fine-tuning resistor ends to generate the reference voltage vref supplied to transistor 119 in FIG. 1 and transistor 415 in FIG. 4. In other embodiments, stacked "resistor ladders" and R-2R structures are used as simple voltage references. However, resistor ladders trade off area and complexity for resolution, and the R-2R structure have matching limitations at the most-significant-bit boundaries and so R-2R structures also trade off area for resolution. The R-2R structure is also less power-efficient compared to the resistor ladder. Referring to FIG. 6, an embodiment of a resistor ladder 600 providing Vout, which in some implementation is used as the reference voltage vref, utilizes fine-tuning resistors 601 and 603 added to the ends of the resistor ladder structure to alleviate concerns associated with traditional resistor ladders and R-2R structures. The fine tuning resistors 601 and 603 are constructed from resistors of the same size unit as the main resistor ladder, to maintain good matching.

The example resistor ladder 600 in FIG. 6 shows an 8-bit DAC structure, although the concept applies to other resolutions. A coarse 16-level selection (4 most significant bits (MSBs)) sets the MSBs part of the output by selecting one of 16 possible taps in the resistor ladder formed by the resistor R. In the example embodiment of FIG. 6, the coarse MSBs have a value that select the tap 605. The fine resistor stages 601 and 603 at the top and bottom of the resistor ladder offset the entire string by 1/16 steps, relative to the coarse selection, using the 4 LSBs (least-significant bits) of the DAC control code. The fine resistor stage 601 at the top of the resistor ladder is set at $((15-a)/16)R$, where "a" represents the LSBs of the DAC control code). The fine resistor stage 603 at the bottom of the resistor ladder is set at $(a/16)R$. Thus, if the four LSBs equal 7, the top fine resistor stage is set at $(8/16)R$ and the bottom fine resistor stage is at $(7/16)R$.

Figure 7:
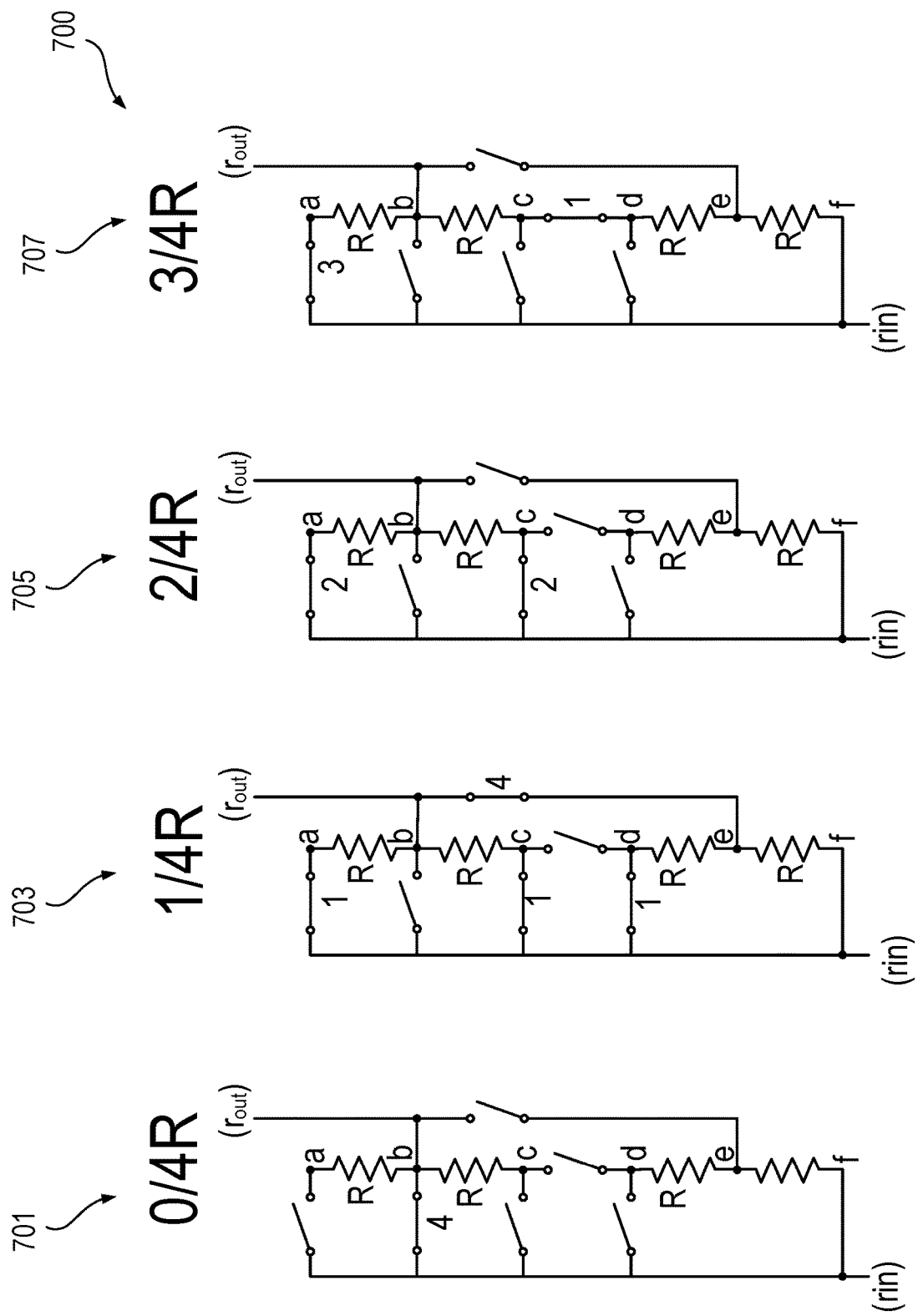
FIG. 7 illustrates an embodiment of a fine tuning stage used in the resistor ladder.

FIG. 7 illustrates an embodiment of a fine-tuning resistor stage 700 utilizing a set of 4 unit-size resistors (units of R)

in 4 unique switching configurations 701, 703, 705, and 707. Switching configuration 701 provides a resistance of (0/4)R. Switching configuration 703 provides a resistance of (1/4)R. Switching configuration 705 provides a resistance of (2/4)R. Switching configuration 705 provides a resistance of (3/4)R. The DAC control code LSBs (a) encoded ((a/16) and (15-a/16)) select the appropriate switch configuration to include as the fine-tuning end resistor value.

Each closed switch includes a number indicating the relative size of the switch, which are implemented as MOS devices. Thus, a 2 next to a switch (see switch configuration 705) indicates 2 W/L of a unit sized transistor used, e.g., in configuration 703 or 707 (a 1 next to the closed switches). A 3 next to a switch indicates 3 W/L of a unit sized transistor (see switch configuration 707). A 4 next to a switch indicates 4 W/L (see switch configurations 701 and 703). By scaling the switch sizes as shown, the equivalent resistance contribution from the switches is the same in all four configurations, so it does not cause a linearity error. That reduces the need to have very low switch on-resistance. It is noted that routing resistance is ideally scaled to match the corresponding switch sizes as well, if the routing resistance cannot be made negligible.

Figure 8:
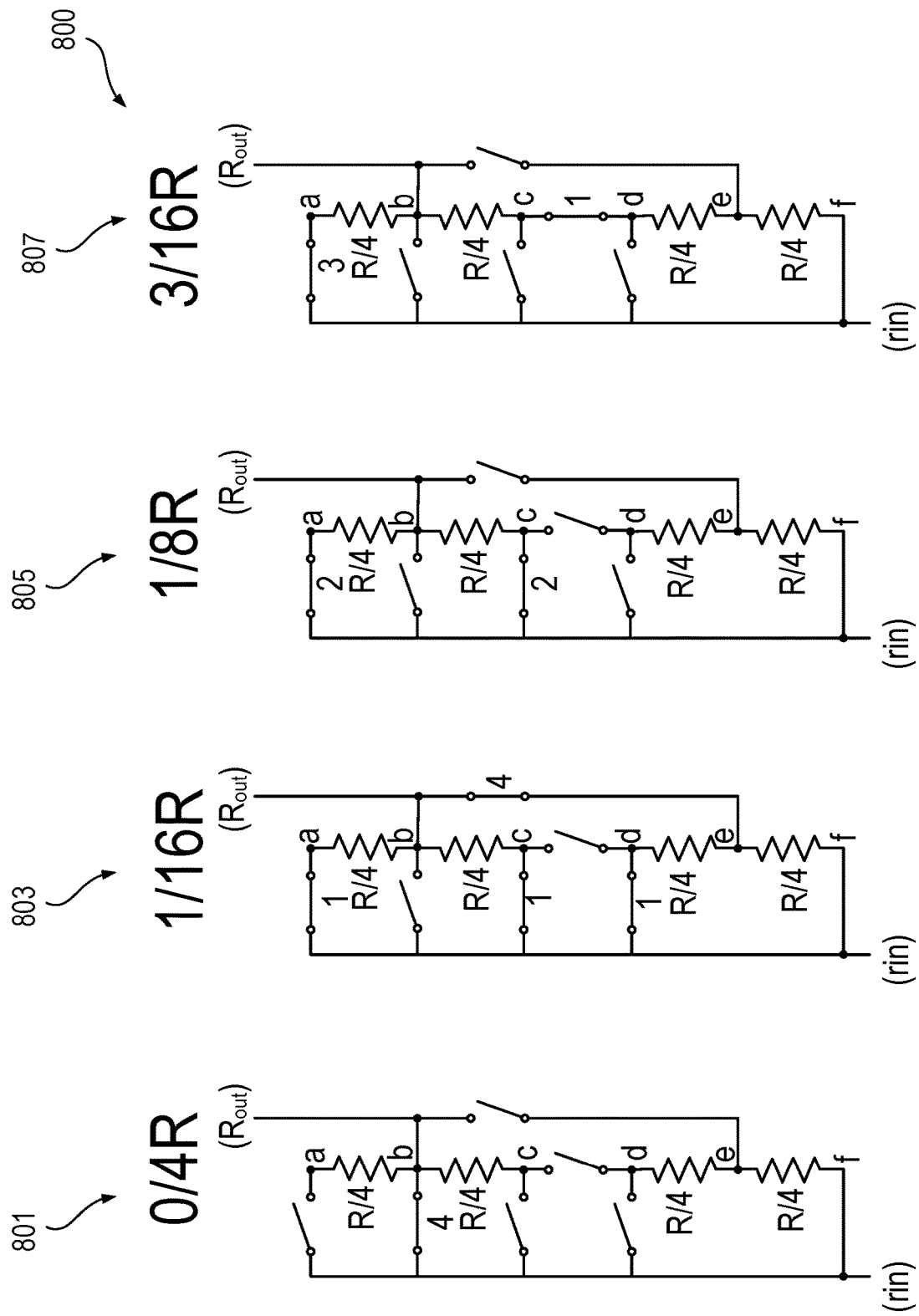
FIG. 8 illustrates an embodiment of another fine tuning stage used in the resistor ladder.

The fine-tuning resistor configurations shown in FIG. 7 provide a gain of 2 bits of resolution by selecting one of the four configurations shown. To reach 8-bits overall resolution, another fine-tuning resistor stage is added in series at each end, where each resistor value is one fourth the resistor value utilized in stage 700. FIG. 8 illustrates an embodiment of the fine-tuning resistor stage 800 utilizing a set of 4 unit-size resistors (units of R/4) in 4 unique switching configurations 801, 803, 805, and 807. Four unit resistors R in parallel implement each of the R/4 unit resistors in the second fine tuning stage 800. Switching configuration 801 provides a resistance of (0/4)R. Switching configuration 803 provides a resistance of (1/16)R. Switching configuration 805 provides a resistance of (1/8)R. Switching configuration 807 provides a resistance of (3/16)R. The DAC control code LSBs select the appropriate switch configuration to include as the fine-tuning end resistor value for the resistor stage 800.

Each fine tuning stage 601 and 603 includes two fine-tuning stages, a fine tuning stage 700 (in operation one of the switch configurations 701-707) and a fine tuning stage 800 (in operation one of the switch configurations 801-807) and operationally each of the fine tuning stages 601 and 603 utilizes 4+4×4=20 unit size resistors and together they add 4 bits of resolution. By way of example, the LSBs having a value of a=7, configures the pull down stage 603 to be 7/16R and the pull up stage 601 to be 8/16R. To achieve 7/16R for the pull down stage, stage 700 is set at 1/4 R (configuration 703) and stage 800 is set at 3/16R (configuration 807). The pull up stage 603 is 8/16R. That sets stage 700 at configuration 705 and stage 800 at configuration 801 to achieve 8/16R.

The resulting resistor ladder structure has a constant amount of current consumption versus DAC code. It can be implemented with less power and in a smaller area compared to a similar resolution R-2R ladder DAC. While the resistor ladder described is utilized in some embodiments to provide a reference voltage for use in a droop detector, the resistor ladder is suitable for utilization in other applications where a particular voltage is desired.

The following shows the derivation of the equivalent resistance for each fine-tuning resistor configuration. Since the switches operate on voltages near the two power supply rails (VDD/VSS), the switch resistance does not vary significantly at different DAC codes. So, we assume the switch resistance depends mainly on the relative switch size. Let "$r_{sw}$" be the switch resistance with a size of 1.

For the 0/4 R configuration: Req=$r_{sw}$/4.
For the 1/4 R configuration:

$$Req = (R+r_{sw}) \| (R+r_{sw}) \| (r_{sw}/4 + (R \| R+r_{sw}))$$

$$= (R/2 + r_{sw}/2) \| (r_{sw}/4 + (R \| R+r_{sw}))$$

Where:
R1∥R2=R1*R2/(R1+R2) (parallel resistance equation)
Start with:
Req1=R∥(R+$r_{sw}$)=R*(R+$r_{sw}$)/(2R+$r_{sw}$)=R/2*(1+$r_{sw}$/R)/(1+$r_{sw}$/(2R))
Assume $r_{sw}$≪R and make use of 1/(1+x)~=1−x, (1+y)(1−x)~=1+y−x, for x≪1, y≪1, Req1~=R/2*(1+$r_{sw}$/2R)=R/2+$r_{sw}$/4
So: Req=(R/2+$r_{sw}$/2)∥($r_{sw}$/4+R/2+$r_{sw}$/4)=R/4+$r_{sw}$/4 (using first order approximation).
For the 2/4R configuration: Req=(R+$r_{sw}$/2)∥(R+$r_{sw}$/2)=R/2+$r_{sw}$/4.
For the 3/4R configuration: Req=(R+$r_{sw}$/3)∥(3R+$r_{sw}$)=(R+$r_{sw}$/3) (1∥3)=(R+$r_{sw}$/3) (3/4)=3/4R+$r_{sw}$/4.

Note that the equivalent resistance follows the desired value (0/4 R, 1/4 R, 2/4 R, 3/4 R), plus a constant offset of $r_{sw}$/4. A similar equivalent resistance derivation can be utilized for the resistance values shown in FIG. 8 by substituting R/4 for R in the derivation.

Thus, various embodiments of a clock synthesizer with integrated voltage droop detection and clock stretching have been disclosed. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. A method comprising:
   supplying an oscillator control current to cause an oscillator to supply an oscillator output signal with a first frequency;
   responsive to occurrence of a voltage droop of a supply voltage, causing a portion of the oscillator control current to be diverted from the oscillator to cause the oscillator to supply the oscillator output signal with a second frequency lower than the first frequency;
   comparing respective reference voltages from a resistor string to a voltage corresponding to the supply voltage in a plurality of comparators and generating a plurality of compare results; and
   selectively turning on shunt circuits based on the compare results to shunt the portion of the oscillator control current to a ground node responsive to the voltage droop.

2. The method as recited in claim 1, further comprising:
   supplying compare results from adjacent comparators to respective interpolator circuits to generate a plurality of control signals for the shunt circuits; and
   wherein the control signals are thermometer encoded.

3. The method as recited in claim 2, further comprising:
   coupling a first terminal of a capacitor to ground through a first transistor when there is no droop present on the supply voltage with a second terminal of the capacitor being connected to ground; and responsive to one of the control signals being asserted, turning off the first transistor and turning on a second transistor to couple the first terminal of the capacitor to a node between the oscillator and a digital to analog converter supplying the oscillator control current.

4. A method comprising:

supplying an oscillator control current to cause an oscillator to supply an oscillator output signal with a first frequency;

responsive to occurrence of a voltage droop of a supply voltage, causing a portion of the oscillator control current to be diverted from the oscillator to cause the oscillator to supply the oscillator output signal with a second frequency lower than the first frequency;

diverting the portion of the oscillator control current through an output leg of a first current mirror circuit responsive to the voltage droop; and adjusting a width to length ratio of the output leg of the first current mirror circuit to adjust a gain of the first current mirror circuit responsive to control bits used to generate the oscillator control current.

5. The method as recited in claim 4 further comprising:

keeping the portion of the oscillator control current that is diverted proportional to the first frequency by adjusting the gain of the first current mirror circuit.

6. The method as recited in claim 4, further comprising:

causing a first current to flow through an input leg of a second current mirror circuit responsive to the voltage droop;

mirroring the first current in the second current mirror circuit to create a second current in an output leg of the second current mirror circuit; and mirroring the second current flowing through an input leg of the first current mirror circuit to cause a third current to flow through the output leg of the first current mirror circuit to divert the portion of the oscillator control current.

7. The method as recited in claim 6, further comprising:

causing substantially zero current to flow through the first and second current mirror circuits responsive to an absence of droop on the supply voltage.

8. The method as recited in claim 6 further comprising:

supplying a reference voltage to a first input of a differential pair circuit;

supplying a voltage corresponding to the supply voltage to a second input of the differential pair circuit;

generating a third current mirror circuit output current in a third current mirror circuit that is determined, at least in part, by the first input;

generating a fourth current mirror output circuit current in a fourth current mirror circuit that is determined, at least in part, by the second input;

mirroring the third current mirror circuit output current in a fifth current mirror circuit to generate a fifth current mirror circuit output current; and determining the first current through the second current mirror circuit using the fifth current mirror circuit output current and the fourth current mirror circuit output current.

9. A clock synthesizer comprising:

an oscillator responsive to an oscillator control current to generate an oscillator output signal having a first frequency;

a droop detector and clock stretching circuit responsive to a voltage droop of a supply voltage, to cause a portion of the oscillator control current to be diverted from the oscillator and take another path away from the oscillator to thereby cause the oscillator to generate the oscillator output signal with a second frequency that is lower than the first frequency;

wherein the droop detector and clock stretching circuit includes:

a droop detector circuit configured to detect the voltage droop and supply an indication of a detected voltage droop; and a plurality of shunt circuits coupled to the droop detector circuit to shunt the portion of the oscillator control current responsive to the indication of the detected voltage droop to thereby cause the oscillator to generate the oscillator output signal with the second frequency.

10. The clock synthesizer as recited in claim 9 wherein a frequency response to the voltage droop is a stepped frequency response.

11. The clock synthesizer as recited in claim 9, where the droop detector and clock stretching circuit comprises:

an analog to digital converter to convert a difference between a reference voltage and a voltage corresponding to the supply voltage to control signals to control the plurality of shunt circuits.

12. The clock synthesizer recited in claim 11, wherein each of the plurality of shunt circuits comprises:

a switching transistor having a gate coupled to one bit of the control signals;

at least one diode connected transistor in series with the switching transistor; and wherein each of the shunt circuits is coupled between a digital to analog converter supplying the oscillator control current and ground.

13. The clock synthesizer as recited in claim 12, wherein the droop detector and clock stretching circuit further comprises:

a shunt speed boost circuit in parallel with one of the shunt circuits, the shunt speed boost circuit including, a first transistor having a gate coupled to a bit of the control signals;

a capacitor having a first terminal coupled to ground through the first transistor when there is no droop present on the supply voltage, a second terminal of the capacitor being connected to ground; and a second transistor having a gate coupled to the bit of the control signals, the second transistor turning on and the first transistor turning off to couple the first terminal of the capacitor to a node between the oscillator and the digital to analog converter responsive to the bit of the control signals being asserted.

14. The clock synthesizer as recited in claim 9, wherein the droop detector and clock stretching circuit comprises:

a plurality of comparators;

a first resistor string coupled to the supply voltage and coupled at respective taps in the first resistor string to respective first inputs of the plurality of comparators;

wherein respective second inputs of the plurality of comparators are coupled to a shifted supply voltage;

a plurality of interpolator circuits, each of the interpolator circuits coupled to outputs of two of the plurality of comparators, the interpolator circuits supplying a thermometer encoded signal as the indication of the detected voltage droop; and wherein each of the plurality of shunt circuits is controlled by a respective bit of the thermometer encoded signal.

15. The clock synthesizer as recited in claim 14 wherein the first resistor string includes a variable resistor to adjust voltage steps across each resistor of the first resistor string.

16. A clock synthesizer comprising:
an oscillator responsive to an oscillator control current to generate an oscillator output signal having a first frequency;
a droop detector and clock stretching circuit responsive to a voltage droop of a supply voltage, to cause a portion of the oscillator control current to be diverted from the oscillator and take another path away from the oscillator to thereby cause the oscillator to generate the oscillator output signal with a second frequency lower than the first frequency;
wherein the droop detector and clock stretching circuit includes a first current mirror circuit having an output leg through which the portion of the oscillator control current flows during the voltage droop; and
wherein control bits supplied to generate the oscillator control current are coupled to adjust a width to length ratio of the output leg of the first current mirror circuit to thereby adjust a gain of the first current mirror circuit to keep the portion of current diverted proportional to the first frequency of the oscillator output signal.

17. The clock synthesizer as recited in claim 16 wherein the droop detector and clock stretching circuit further comprises:
a second current mirror circuit having a second current mirror circuit input leg through which a first current flows during the voltage droop;
the second current mirror circuit to mirror the first current to create a second current mirror circuit output current in a second current mirror circuit output leg; and
the first current mirror circuit being configured to mirror the second current mirror circuit output current to generate a first current mirror circuit output current, the first current mirror circuit output current corresponding to the portion of the oscillator control current diverted in response to the voltage droop.

18. The clock synthesizer as recited in claim 17, wherein the droop detector and clock stretching circuit further comprises:
a differential pair circuit having a first input coupled to a reference voltage and a second input coupled to a voltage corresponding to the supply voltage;
a third current mirror circuit configured to generate a third current mirror circuit output current determined, at least in part, by the first input;
a fourth current mirror circuit configured to generate a fourth current mirror output circuit current determined, at least in part, by the second input;
a fifth current mirror circuit configured to mirror the third current mirror circuit output current to generate a fifth current mirror circuit output current;
wherein the first current through the second current mirror circuit is determined by the fifth current mirror circuit output current and the fourth current mirror circuit output current; and
wherein the first current is substantially zero during an absence of droop on the supply voltage and nonzero during the voltage droop.

19. The clock synthesizer as recited in claim 16 further comprising:
a resistor ladder to provide a reference voltage for use by the droop detector and clock stretching circuit, the resistor ladder including,
a plurality of series connected unit resistors, each having a resistance R, to provide a course voltage according to most significant bits of a digital control value;
a first fine tuning resistance disposed at a first end of the resistor ladder;
a second fine tuning resistance disposed at a second end of the resistor ladder; and
wherein the first and second fine tuning resistance each include a plurality of switching configurations where an equivalent resistance contribution from switches in each of the switching configurations is equal.

20. The clock synthesizer as recited in claim 16 wherein a frequency response to the voltage droop is a linear response.

* * * * *